(12) United States Patent
Johnson

(10) Patent No.: US 9,654,110 B2
(45) Date of Patent: May 16, 2017

(54) RECONFIGURABLE MAGNETOELECTRONIC PROCESSING CIRCUITS

(71) Applicant: Mark B Johnson, Potomac, MD (US)

(72) Inventor: Mark B Johnson, Potomac, MD (US)

( * ) Notice: Subject to any disclaimer, the term of this patent is extended or adjusted under 35 U.S.C. 154(b) by 0 days.

(21) Appl. No.: 15/250,784

(22) Filed: Aug. 29, 2016

(65) Prior Publication Data

US 2016/0373114 A1 Dec. 22, 2016

Related U.S. Application Data

(63) Continuation-in-part of application No. 14/703,006, filed on May 4, 2015, now Pat. No. 9,432,021, and a continuation-in-part of application No. 15/219,928, filed on Jul. 26, 2016, said application No. 14/703,006 is a continuation of application No. 14/133,055, filed on Dec. 18, 2013, now Pat. No. 9,024,656, said application No. 15/219,928 is a continuation of application No. 14/133,055, filed on Dec. 18, 2013, now Pat. No. 9,024,656.

(60) Provisional application No. 61/739,757, filed on Dec. 20, 2012.

(51) Int. Cl.
| | | |
|---|---|---|
| *H03K 19/173* | (2006.01) | |
| *H03K 19/177* | (2006.01) | |
| *G11C 11/16* | (2006.01) | |
| *H03K 19/0175* | (2006.01) | |

(52) U.S. Cl.
CPC ........ *H03K 19/1776* (2013.01); *G11C 11/161* (2013.01); *G11C 11/1673* (2013.01); *G11C 11/1675* (2013.01); *H03K 19/017581* (2013.01)

(58) Field of Classification Search
CPC ....... H01L 27/22; H01L 27/222; G11C 11/16; G11C 11/161; G11C 11/18
See application file for complete search history.

(56) References Cited

U.S. PATENT DOCUMENTS

| | | | | | |
|---|---|---|---|---|---|
| 5,629,549 | A | * | 5/1997 | Johnson ................ | G11C 11/16 257/421 |
| 5,652,445 | A | * | 7/1997 | Johnson ................ | G11C 11/16 257/295 |
| 6,140,838 | A | * | 10/2000 | Johnson ................ | G11C 11/16 326/136 |
| 7,379,321 | B2 | * | 5/2008 | Ravelosona ........... | G11B 5/193 257/30 |
| 7,397,285 | B2 | * | 7/2008 | Agan .................... | H03K 19/20 326/104 |
| 9,024,656 | B2 | * | 5/2015 | Johnson ......... | H03K 19/017581 326/37 |
| 9,331,266 | B2 | | 5/2016 | Chang et al. | |
| 9,432,021 | B2 | * | 8/2016 | Johnson ......... | H03K 19/017581 |

(Continued)

OTHER PUBLICATIONS

Behin-Aein, B. et al., "Proposal for an All-Spin Logic Device with Built-in Memory," Nature Nanotech 5, 266 (2010).

(Continued)

*Primary Examiner* — Jason M Crawford
(74) *Attorney, Agent, or Firm* — J. Nicholas Gross

(57) ABSTRACT

Magnetoelectronic circuits include Hybrid Hall Effect devices implemented with Spin Transfer Torque write capability. The circuits include reconfigurable processing systems, logic circuits, non-volatile switches, memory cells, etc.

22 Claims, 14 Drawing Sheets

(56) References Cited

U.S. PATENT DOCUMENTS

| | | | | |
|---|---|---|---|---|
| 2014/0056060 A1* | 2/2014 | Khvalkovskiy | ........ | H01L 27/228 365/158 |
| 2014/0167814 A1* | 6/2014 | Chang | .................... | H03K 19/16 326/38 |
| 2014/0169088 A1* | 6/2014 | Buhrman | ................ | G11C 11/18 365/158 |
| 2014/0176184 A1* | 6/2014 | Johnson | ............. | H03K 19/1776 326/37 |

OTHER PUBLICATIONS

Johnson, Mark et al., "Magnetoelectronic Latching Boolean Gate," Solid State Electronics 44, 1099 (2000), 6 pages.

Johnson, Mark; "Magnetic Logic: Fundamentals, Devices, and Applications," Wiley Encyclopedia of Electrical and Electronics Engineering, ed. John Webster; John Wiley and Sons, Inc. Hoboken, NJ, 2015.

Joo, S. et al., "Magnetic field controlled reconfigurable semiconductor logic," published online in Nature, approximately Jan. 30, 2013, 15 pages.

Ney, A. et al., "Programmable Computing with a Single Magnetoresistive Element," Nature 425, 485 (2003), 3 pages.

Salahuddin, S., "A new spin on spintronics," published online in Nature, Feb. 7, 2013, 2 pages.

Xu, P. et al., "An All-Metal Logic Gate Based on Current-Driven Domain Wall Motion," Nature Nanotech 3, 97 (2008), 4 pages.

\* cited by examiner

|     | NAND | NOR | AND | OR | XOR |
|-----|------|-----|-----|----|-----|
| C1  | 0    | 1   | NA  | NA | 0   |
| C2  | NA   | NA  | 0   | 1  | 1   |
| RB1 | 1    | 1   | 0   | 0  | 1   |
| RB2 | 0    | 0   | 1   | 1  | 1   |

FIG. 3B

RECONFIGURABLE MAGNETOELECTRONIC PROCESSING CIRCUITS

RELATED APPLICATION DATA

The present application claims priority to and is a continuation-in-part of Ser. No. 14/703,006 now U.S. Pat. No. 9,432,021 and Ser. No. 15/219,928 both of which are continuations of Ser. No. 14/133,055 now U.S. Pat. No. 9,024,656, which in turn claims the benefit under 35 U.S.C. §119(e) of the priority date of Provisional Application Ser. No. 61/739,757 filed Dec. 20, 2012, all of which are hereby incorporated by reference. The present application is also related to U.S. Ser. No. 15/250,779 filed on the present date, and which is also incorporated by reference herein.

STATEMENT AS TO GOVERNMENT RIGHTS

This application is a continuation in part and claims priority to an application that was filed during a time when the inventor was employed by the Naval Research Laboratory as part of Task Area MA02-01-46, Work Unit T042-97, and was developed as a result of efforts associated with NRF grants funded by MEST (2010-0000506, 2011-0012386 and 2012-0005631), the industrial strategic technology development program funded by MKE (KI002182), the Dream project, MEST (2012K001280), GRL and the Office of Naval Research. To the extent they are not otherwise alienated, disclaimed or waived, the government may have certain limited rights to use, practice or otherwise exploit some or all portions of the inventions herein.

FIELD OF THE INVENTION

The present invention relates to non-volatile logic and memory elements/circuits, and particularly composite circuits using both magnetoelectronic and semiconductor devices. The invention has particular relevance to methods and circuits that perform information processing with very low power consumption.

BACKGROUND

The following references are also incorporated by reference herein:
Mark Johnson, U.S. Pat. No. 5,652,445 (July, 1997).
Mark Johnson, U.S. Pat. No. 6,140,838 (October, 2000).
Mark Johnson, B. R. Bennett, P. R. Hammar and M. M. Miller,
"Magnetoelectronic Latching Boolean Gate," Solid-State Electronics 44, 1099 (2000).
Sungjung Joo, Mark Johnson, et al., "Magnetic Field Controlled Reconfigurable Semiconductor Logic," Nature 494, 72-75 (2013).
Mark Johnson, "Magnetic Logic: Fundamentals, Devices, and Applications," Wiley Encyclopedia of Electrical and Electronics Engineering, ed. John Webster, (John Wiley and Sons, Inc., Hoboken, N.J., 2015).
Mark Johnson, U.S. Pat. No. 9,024,656 (May, 2015).

U.S. Pat. No. 9,024,656 by the present inventor (incorporated by reference herein), describes a system and method for performing low power logic operations. Whereas logic operation performed with traditional semiconductor technology relies on periodic synchronized pulses from a clock, operation of the low power technique uses individual pulses. In the former case, the logic system is constantly powered on. In the latter case, the quiescent state of the system is off. Power is applied only during the brief intervals when individual pulses are required. At all other times, the system draws no power. In 656, this novel kind of digital logic processing is called nonvolatile logic.

The invention described in '656 was motivated by the development of a novel device, the magnetic field controlled avalanche diode (MFCAD). The MFCAD is described in the article (Nature, 2013) and in U.S. Pat. No. 9,331,266 B2 (Joonyeon Chang, Mark Johnson et al., "Magnetic Field Controlled Reconfigurable Semiconductor Logic Device and Method for Controlling Same"). This device can behave as a nonvolatile reconfigurable Boolean logic cell. Patent '656 showed how the reconfigurable cell could be used for constructing logic building blocks, including as an Arithmetic Logic Unit (ALU) that performs binary logic operations. The patent then developed and presented an architecture for a nonvolatile digital logic and signal processing system. Dramatic power savings can be achieved because the normal operational state is "off." When an operation is required, individual pulses are applied and, when the operation is complete, the results are stored in nonvolatile memory and the system returns to the quiescent, zero power condition.

The magnetic field controlled avalanche diode is a type of magnetoelectronic device where the output is an electric current. Most magnetoelectronic devices, for example the spin valve (SV) and the magnetic tunnel junction (MTJ), are magnetoresistors. They behave as variable resistors with bistable LOW and HIGH resistance values that are associated with binary 0 and 1. The resistance state is a function of the magnetization orientation of one (the free ferromagnetic layer) of two ferromagnetic layers in the SV or MTJ. The resistance state can be set (i.e. written) using a magnetic field to set a magnetization orientation state. For integrated devices, the magnetic field is associated with an electric current. The write current may be applied through an inductively coupled write wire and produces a local magnetic field. Alternatively, the write current may be a spin polarized current injected directly into the ferromagnetic layer. The resistance state of the magnetoresistor then is sensed (i.e. read out) by applying a bias and measuring the resistance. The resistance state of the SV and MTJ is detected by electric transport properties associated with a spin polarized current that transits both ferromagnetic layers. Because magnetoresistors typically have a large resistance value, the bias is commonly a current and the output is read out is a voltage.

Thus, a typical magnetoelectronic device has current input and voltage output. These characteristics are ideal for nonvolatile memory but are problematic for logic. Digital logical processing requires multiple operations. One gate is linked to subsequent gates by fanout, with the output of one gate providing the input to one or more subsequent gates. Fanout requires that device output preferably should be a reliable and reproducible current source.

In the MFCAD, the channel of an avalanche diode has resistance values that depend on the orientation of an applied magnetic field. The diode typically is biased by a voltage and the output is a current that depends on the magnetic field. The MFCAD differs from the SV and MTJ because detecting the output does not involve spin polarized current flowing in the channel of the device. For the integrated MFCAD, the external magnetic field is provided as a local fringe magnetic field near the ends of one or more patterned ferromagnetic elements. The magnetization states of the ferromagnetic elements, and therefore the locally applied fields, are bistable and nonvolatile.

Thus, the MFCAD is characterized as a device with bistable magnetization configurations that are set by applying an input write current to patterned ferromagnetic elements in the MFCAD device cell. For read out, the diode channel is biased with a voltage to give an output in the form of a current, with bistable output current values that depend on the locally applied magnetic field, and therefore depend on the magnetization configuration of the ferromagnetic elements. As such, it is well suited for use in circuits with other MFCADs, or with other magnetoelectronic devices, where the input is required to be a current. A disadvantage of the MFCAD is that while it is a promising device, it is in an early stage of research and development and has not been commercialized.

The MFCAD has demonstrated basic reconfigurable functions. As described in (Nature, 2013) and '266, one embodiment of an MFCAD reconfigurable cell can be reconfigured to perform an AND or OR function. A different embodiment can be reconfigured to perform a NAND or NOR function. The architecture described in '656 is general and works for an ALU that can be reconfigured to perform more than two Boolean functions. However, the example presented in '656 involved an ALU that could be reconfigured to perform two functions, the AND or OR function.

SUMMARY OF THE INVENTION

An object of the present invention, therefore, is to overcome the aforementioned limitations of the prior art.

An object of the present invention therefore is to overcome some of the limitations of existing MFCAD structures by developing ALUs that involve other magnetoelectronic devices, including specifically a suitable Hybrid Hall Effect (HHE) device. A further objective is to develop ALUs comprising composite sub-circuits that include a magnetoelectronic device along with one or several semiconductor transistors.

Another object of the present invention is to provide an improved HHE device cell that can operate as the ALU that is used in the nonvolatile logic architecture of '656. Equivalently stated, this shows that the nonvolatile architecture of '656 can be implemented using an appropriate HHE cell.

Another object of the invention is to provide a composite HHE cell that has CMOS level outputs, which thereby offers further significant improvement.

A further object of the invention is to show that simple combinations of the composite HHE device cells can operate as the ALU and perform reconfigurable functions of AND, OR, NAND, NOR and XOR. Therefore the improved composite HHE cell expands the utility of the ALU and thereby offers significant advantages.

A further object of the invention is to show how a magnetoelectronic device, the HHE, can be used in combination with one or more CMOS FETs to form a cell that behaves as an appropriate nonvolatile switch.

Still a further object of the invention is to show how a magnetoelectronic device, the HHE, can be used with a small number of CMOS FETs to form a memory cell. The sub-circuit for this cell is nearly identical with the nonvolatile reconfigurable Boolean logic cell that is used as the ALU.

Furthermore, a final object of the invention is to show that this NV memory cell can be used with CMOS logic sub-circuits and circuits. When used at the output stage, this NV memory cell can store the results of an operation. The sub-circuit or circuit then can be powered down until the result is needed at a later time. The result then can be recalled in the form of a CMOS compatible binary pulse.

It will be understood from the Detailed Description that the inventions can be implemented in a multitude of different embodiments. Furthermore, it will be readily appreciated by skilled artisans that such different embodiments will likely include only one or more of the aforementioned objects of the present inventions. Thus, the absence of one or more of such characteristics in any particular embodiment should not be construed as limiting the scope of the present inventions.

DESCRIPTION OF THE DRAWINGS

FIG. 3B is a truth table for the reconfigurable cell of FIG. 3A illustrating that the cell can perform the Boolean functions: AND, OR, NAND, NOR, XOR.

DETAILED DESCRIPTION

The devices, circuits and logic units described in this invention have important advantages. Several embodiments are reconfigurable to perform multiple Boolean operations, such as AND, OR, NAND, NOR, XOR and XNOR.

All embodiments preferably have output levels where LOW is essentially zero and HIGH is a positive voltage. The HIGH output voltage typically is high enough to provide output as a current. Such levels are readily sensed and then associated with binary "0" and "1." This is an advantage over the MFCAD where LOW output is not exactly zero. Furthermore, this is an advantage over magnetoresistive devices where a LOW output is also not exactly zero.

Furthermore, several embodiments disclosed herein provide output voltages at calibrated semiconductor CMOS levels $V_{DD}$ and $V_{SS}$. Such levels are appropriate for integration with traditional semiconductor digital electronic (SDE) devices. Furthermore, these levels can be easily converted in turn to current pulses with amplitudes that are sufficient to provide output from one stage to input at one or more subsequent reconfigurable magnetoelectronic cells/circuit stages.

The main embodiment discussed below is an improved HHE device which can be employed in a new type of magnetoelectronic cell. This cell can be configured for many purposes, including to operate as the ALU that is used in the nonvolatile logic architecture of '656 and perform reconfigurable functions of AND, OR, NAND, NOR.

In addition, patent '656 employs several "nonvolatile pass switches" (NV pass switch). For example, such a switch is used to open or close access to a data bus or address bus. The devices described here, in combination with one or more CMOS FETs, can form a cell that behaves as an appropriate nonvolatile switch.

The '656 patent also employs several nonvolatile memory cells (NV memory). For example, such a cell is used as a test register at the output stage of the ALU, and such cells are used as registers at the data input ports. The devices described herein can be implemented as such form of memory cell.

Figure 1:
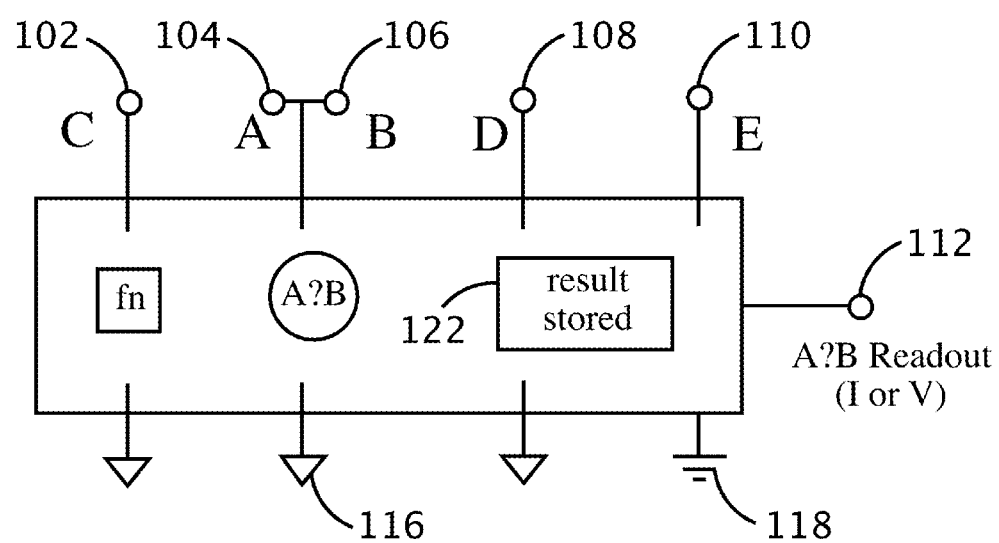
FIG. 1 is a schematic diagram of a preferred embodiment of a reconfigurable non-volatile logic unit implemented in accordance with the teachings of the '656 patent.

FIG. 1 presents a symbolic description of a generic ALU 100 that is central to the architecture of '656. The operation of this ALU is summarized here to better understand the context of the innovations of the present disclosure. As stated in the Background, the ALU in '656 was based on a preferred embodiment in which a MFCAD is used as the preferred reconfigurable logic element. A pulse applied to terminal C 102 configures or determines the Boolean function A?B (AND or OR; NAND or NOR). At a later time, input pulses applied to terminals A 104 and B 106 (pulses to A and B are synchronous, but the pulse to C occurs at any prior time) result in a configuration of the magnetization orientations of ferromagnetic elements that provide local fields to the avalanche diode. These fields set/determine the output current of the diode. At any later time, a readout voltage pulse applied to terminal D 108 results in a current through the diode. The current has stable LOW (binary 0) or HIGH (binary 1) values representing the result of the selected Boolean operation on input A, B.

In FIG. 1, the "result stored" box 122 has the following meaning. Once inputs C, A and B are applied, the reconfigurable device in the ALU is in a nonvolatile configuration (retains a logic state) that represents the result of the process A?B. Applying a read bias to terminal D 108 reads out the result by sensing the state of the ME device.

Patent '656 also states that a separate nonvolatile memory element (for example, an MTJ) may be incorporated in cell 100. The first time 108 is activated to read a result, that result also is preferably stored in the separate ME memory device 122. In the preferred embodiment envisioned in '656, the reconfigurable device is the MFCAD, which normally gives output as an electric current. A (current or voltage) bias pulse applied to terminal E 110 at any time will provide voltage readout at output 112 as an alternative to current readout. As discussed in '656, the separate nonvolatile memory element 122 may use a ground 118 that differs from the ground 116 used by the reconfigurable logic device. For purposes of simplifying and understanding the more important aspects of the to present invention, less essential features of the device (such as the grounds for the input are readout functions) are omitted from further discussion herein.

The following paragraphs explain how new forms of HHE devices can be used to form a reconfigurable Boolean logic unit that is operationally identical, in all necessary aspects, with the unit formed using the MFCAD. Each of these cells therefore can be used or substituted for such MFCADs in the architecture developed in '656 as desired for any particular application.

A reconfigurable logic cell, using a Hybrid Hall Effect (HHE) device as the ferromagnetic element, was disclosed in U.S. Pat. No. 6,140,838 (incorporated by reference herein). Briefly describing a typical embodiment, a Hall cross is fabricated using any semiconductor material. A preferred embodiment uses a high mobility semiconductor material such as a two dimensional electron system (2DES) heterostructure. A thin electrically insulating layer coats the top of the Hall cross. Two opposite arms of the cross (for example horizontally opposite, defining the x-axis) are connected to a readout bias source (voltage or current). The other two arms (for example vertically opposite, defining the y-axis) provide an output voltage to a sense circuit. A patterned, thin film ferromagnetic element (F) is fabricated on top of the electrically insulating layer, with one edge over the center of the Hall cross. In one common embodiment, the F element is an ellipse or rectangle with aspect ratio of three to one and is oriented with the long axis of the ellipse along the horizontal axis of the Hall cross.

The F element is fabricated to have two stable magnetization states, with uniform magnetization along the +/−x-axis. Fringe magnetic field from the end of F generates a positive or negative Hall voltage measured along the y-axis, when bias current I is applied along the horizontal arms. The Hall voltage is linear with current and is identified as +/−$DV_H$ or, equivalently, as +/−$DR_H$, where $DR_H=DV_H/I$. When the Hall cross is fabricated to have a small asymmetry in the positions of the vertical arms, a small resistance is included in the output voltage circuit and the output has discrete levels of 0 (LOW) or +2$DV_H$ (HIGH). Input is provided as current pulses applied to inductively coupled integrated write wires. The magnetic field generated by each current pulse and locally applied to F may flip the magnetization orientation of F between the two stable states.

It can be noted that the physical principles of operation for the HHE magnetolectronic device are somewhat analogous with those of the MFCAD. There is no spin polarized current in the Hall channel and there is no spin polarized current in the diode channel of the MFCAD. The output voltage is generated from an applied magnetic field and a classical Lorentz force exerted on the bias current. Like the integrated MFCAD, the magnetic field is locally applied as the fringe field of a patterned ferromagnetic element that has bistable magnetization orientations. These orientations are written with input currents.

Figure 2A:
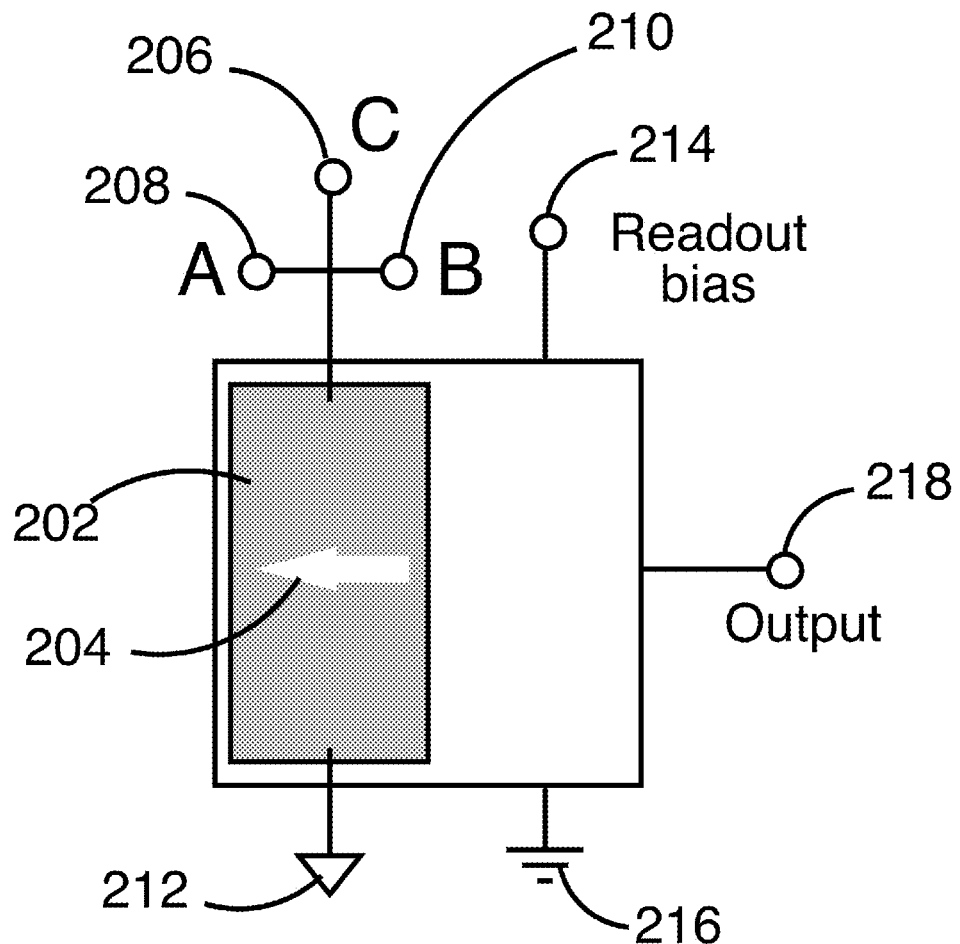
FIG. 2A is a schematic description of a circuit symbol that represents a prior art HHE device as shown in the '838 patent.

A generic representation of a conventional HHE device is shown using the symbol in FIG. 2A. Rectangle 202 represents a first ferromagnetic element F, and arrow 204 represents a magnetization orientation binary state (left or right, with fringe fields that correspond with LOW and HIGH output, respectively). An initial orientation (to the left in FIG. 2A) for this ferromagnetic element is set with a reset pulse applied to any input terminal. At any time following this, three input current pulses are applied simultaneously through write wires, grounded at first ground 212, to perform a selected logic operation. As stated above, a local magnetic field is associated with each current pulse. The superposition of fields from the three separate independent pulses is applied to ferromagnetic element F 202, potentially causing a magnetization of such element to change orientation in response to such combined fields. The prior art HHE device therefore does not use a spin polarized current to set a state of the ferromagnetic element F.

A first pulse to control terminal C 206 determines the logic function, or operation, of the gate, for example AND or OR. The data input pulses (for the logical operands A, B) are applied to terminals A 208 and B 210. The result of the logical process is stored as a magnetization orientation 204 of ferromagnetic element 202.

At any later time, a pulse applied to Readout bias 214 and grounded at a second ground terminal 216 provides a bias (voltage or current) imposed across two opposite arms of the Hall cross (horizontal arms in the above paragraph). The Output includes two different possible values, and is expressed by a floating output voltage, 0 or +2DV$_H$, that is made available at Output 218 to a sense circuit. This voltage is supplied from one of the transverse Hall cross arms (a vertical arm in the above paragraph). An appropriate ground 216 for the output voltage depends on details of the sense circuit, but the opposite Hall cross arm can be used. The current read from the prior art HHE device therefore is also not spin polarized.

Patent '838 describes two operational modes of the HHE device, namely latching and non-latching. The latching mode is appropriate for the nonvolatile logic technique used in the architecture in '656. As seen in FIG. 2A, a typical operation begins with a Reset pulse that sets an orientation M 204 to the left. The Reset pulse preferably has negative electric polarity and the associated field is shown pointing to the left. In a second step, positive polarity current pulses (of zero or unit amplitude) preferably are applied to terminals A, B and C. If the superposition of local magnetic fields is sufficient to exceed a characteristic value of a switching field of ferromagnetic element 202—which can be configured by an appropriate selection of materials, geometry, etc.—this causes an orientation 204 to reverse and point to the right. If the superposition of fields does not exceed the value of the switching field of element 202, the orientation 204 remains to the left.

The result of the Boolean operation is represented as the resulting nonvolatile orientation 204 and can be read out at any desired later time. An orientation pointing to the left (right) produces voltage V$_{Out}$=0, binary 0 (V$_{Out}$=2 DR$_H$, binary 1). In a typical embodiment, this operation would be used for Boolean AND or OR operations. The reset current pulse for HHE 200 in this instance has negative polarity. There are several known techniques for providing a bipolar power supply on a chip including as developed for commercial MRAM. Therefore there is minimal inconvenience or circuitry associated with providing these uniform negative current reset pulses.

To perform NAND and NOR operations, an initial orientation M 204 is set to the right. The resulting fringe field configuration corresponds to a HIGH output value, and a readout performed after initialization would give V$_{Out}$=2DR$_H$. Inputs to in the form of negative current pulses of sufficient magnitude change the orientation to point to the left. The fringe field configuration then corresponds to a LOW output value, V$_{Out}$=0.

Although it may be relatively simple to provide negative reset pulses to any HHE device 200 in a circuit, for any operation, it may not be convenient to provide negative current inputs at some times and positive current inputs at other times. Similarly, it may not be convenient to provide negative reset pulses at some times and positive reset pulses at other times.

Figure 2B:
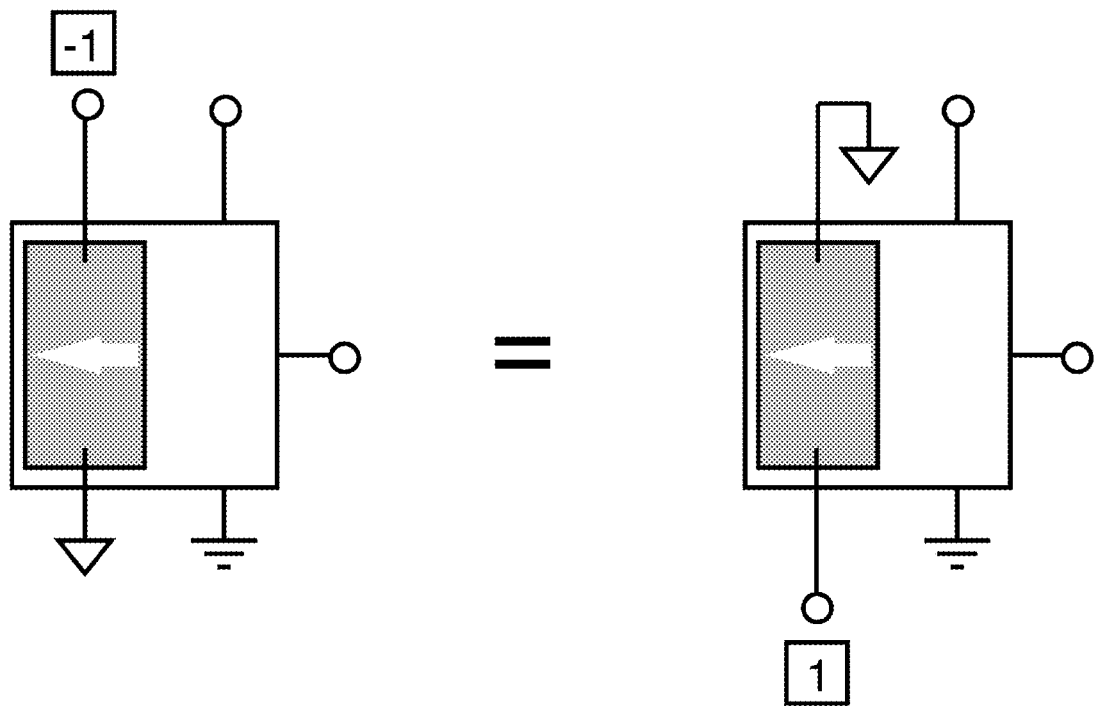
FIG. 2B is an embodiment of a variant of an HHE device that has inverted inputs.

A modification presented in the '838 addresses this issue. It is well known that the write wire can be inverted geometrically, as shown in the right hand side of FIG. 2B. In this case, a positive polarity write pulse (of appropriate magnitude) orients magnetization orientation M 204 to the left and a negative polarity pulse orients M to the right. This is operationally the same as using the original (non-inverted) write wire structure (left had side of FIG. 2B) with opposite polarity write pulses: in other words, a non-inverted structure with a negative write pulse (signified by the box with "−1" in the left panel) can achieve the same result as an inverted structure with a positive polarity write pulse (signified by the box with "1" in the right panel).

A more efficient means of controlling (writing) the magnetization orientation 204 of F 202, and providing inputs to A 208, B 210 and C 206, uses a Spin Transfer Torque (STT) write process (Mark Johnson, *Wiley Encyclopedia*, 2015; and references therein). An HHE device with STT inputs and which is written using spin polarized current is a significantly improved device. The STT process is used to set magnetization states of the patterned F elements in the MFCAD embodiment referenced in the '266 patent.

A brief review of a general STT process is given here (Mark Johnson, *Wiley Encyclopedia*, 2015, which is incorporated by reference). To begin, an electric current that is driven across an interface between a ferromagnetic metal film ($F_1$) and a second metal film, either nonmagnetic (N) or ferromagnetic ($F_2$), is a spin polarized. This spin polarized current, J, maintains its polarization in the second metal film for a relatively long time. In a qualitative description of the STT process, the spin polarized current from a pinned ferromagnetic source film, $F_p$, is driven across an interface and into a second film $F_f$ with magnetization orientation that can be altered (freely set or not pinned).

If the spin polarization set in the second film is antiparallel with the alignment of the spin polarized current, the injected electron spins relax their orientation. However, spin is a conserved quantity and thus the spin angular momentum lost by the injected electrons is transferred to some of the localized electrons in $F_f$. The injected current provides a constant source of spin angular momentum of a single sign and eventually the orientation of spontaneous magnetization M of the second film aligns with that of $F_p$. An orientation antiparallel with that of $F_p$ is achieved by reversing the electrical polarity of the spin injected current. This STT process has a quantum efficiency of nearly unity. A complete STT switching event depends on several factors, including the amplitude and duration of the injected current pulse and occurs on an approximate time scale of 1-10 nsec.

Figure 2C:
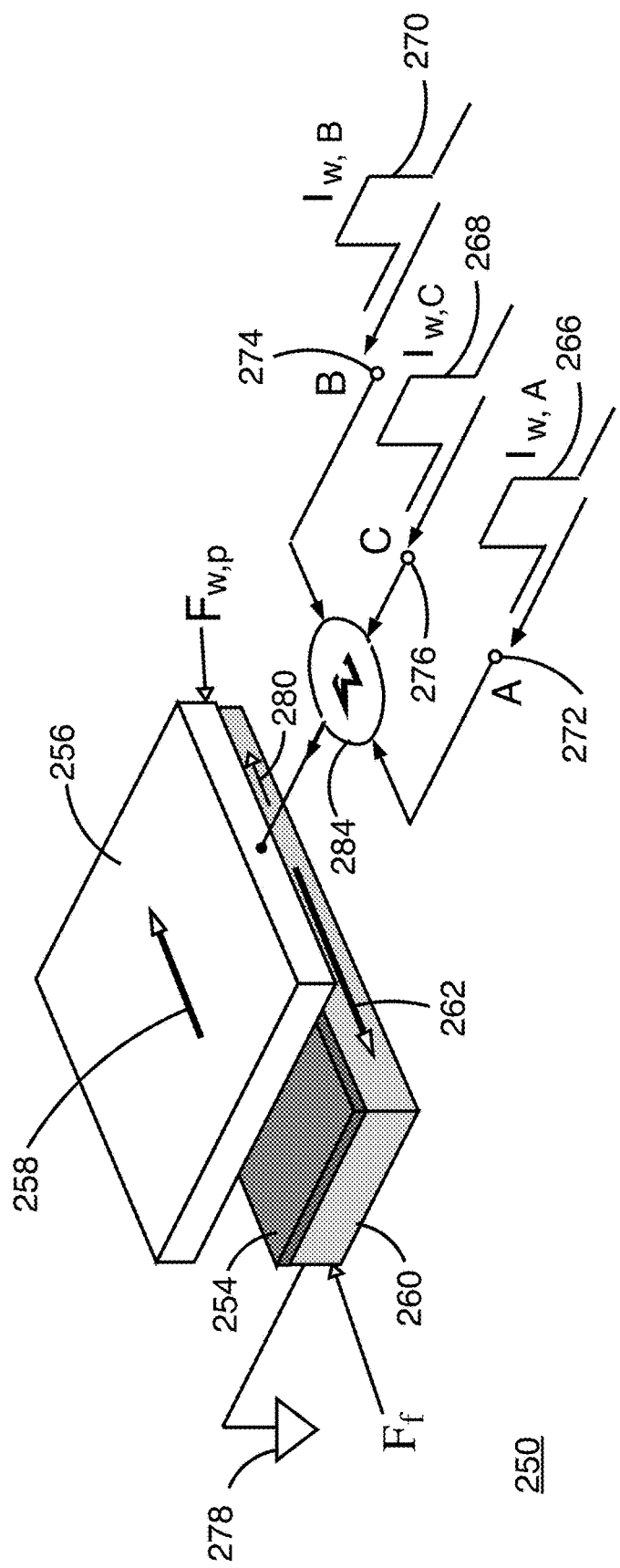
FIG. 2C is a perspective sketch of an improved HHE device embodiment implemented in accordance with the present teachings, showing a ferromagnetic layer of the HHE device, and supporting structures/components used to apply a Spin Torque Transfer (STT) input.

An HHE device with STT inputs written by a spin polarized current has significant advantages over the prior art HHE device that has a single ferromagnetic film that is written using a magnetic field imposed by inductively coupled write wires. A preferred embodiment of the new HHE device 250 has a ferromagnetic film $F_f$ with STT inputs. The film $F_f$ and components used for the STT process is depicted in FIG. 2C. A thin low transmission barrier 254 is preferably fabricated from a non-magnetic layer (with common materials being aluminum oxide $Al_2O_3$, magnesium oxide MgO for tunnel barriers or copper in the case of a metal barrier) and located between a thin source ferromagnetic film 256, with pinned magnetization orientation 258, and a free ferromagnetic film $F_f$ 260, with an orientation 262 that has at least two bistable states. Input current pulses 266, 268 and 270 can be applied at terminals A 272, B 274 and C 276, respectively, and grounded at 278. Source ferromagnetic film 254 is preferably sufficiently thin enough so that its fringe field does not interfere with the fringe field resulting from free ferromagnetic field film 260. The combined input current J 280 that enters $F_f$ 260 is spin polarized and may, for sufficient magnitude, change an orientation 262. It will be understood by those skilled in the art that this is merely one preferred method of imparting a spin polarized current, and that other techniques known or later developed in the art can be adapted to accomplish the same result for device 250.

Summing the input currents, represented by node S 284, may be done using separate wires or may be done with more complex techniques apparent to those skilled in the art in accordance with the goals of the present disclosure. Because a completed switch (of the orientation 262) depends in part on the duration of a pulse, a time-based write technique can use pulses that arrive sequentially (or with some overlap) with a combined duration of the sequence of pulses chosen to be adequate for a complete switch. A current pulse of desired magnitude can be delivered by known techniques in the art, including choosing appropriate impedance for the write wire layers, and in most such cases currents applied to multiple terminals on a single write line will sum because impedances merely add in parallel. Other cases will be apparent to skilled artisans and may require or use a different approach than proposed here, but the precise implementation of such schemes is not critical and is believed to be application specific. Note that the reset pulse required at the beginning of any operation can be a single pulse of the appropriate polarity and amplitude and may be applied to A, B or C.

Figure 2D:
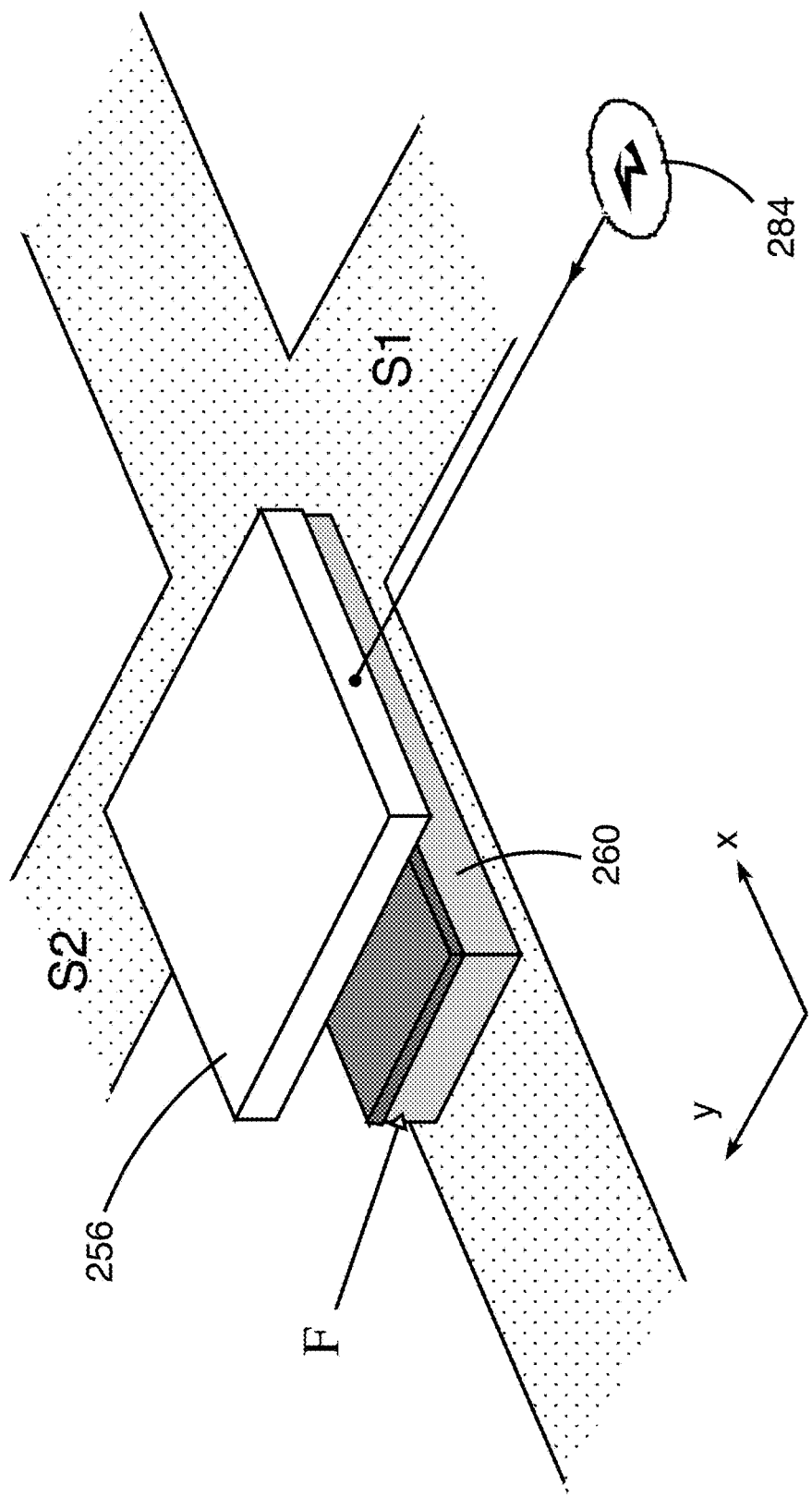
FIG. 2D is another perspective sketch of the of the improved HHE device embodiment of the present disclosure that has an STT input.

An improved HHE device having STT input is further shown with the perspective sketch in FIG. 2D. The sketch uses the same approximate geometry depicted for the prior art HHE device in '445. For a write input, however, current pulses are summed at node 284, then passed through the pinned source layer 256 and into the ferromagnetic layer 260 in the form of a spin polarized current. For readout (output), a bias current pulse is applied along the Hall cross arms parallel with the x-axis. The output voltage pulse is sensed between the transverse arms, using terminals connected to S1 and S2 as with the prior art approach.

The HHE device in the '838 has output levels of LOW, V~0V, and HIGH, $V=2DV_H$~10 to 100 mV for typical Readout bias current I. The HIGH level is to sufficient to exceed the gate threshold of some semiconductor FETs. However, these logic levels are not appropriate for integration with conventional SDE. Furthermore, the HIGH level is not an optimal value for providing input current to subsequent devices (to support fanout). The output of ~100 mV is applied to a total resistance $R_{tot}$ that is the sum of a 50 Ohm impedance line wire plus the resistance of the STT layers. The total resistance is the order 100 to 1000 Ohms, and the output current available for STT input varies from 0.1 to 1 mA. This may be adequate for providing STT current input for a single following ME device. However, it's generally not sufficiently large to provide fanout to multiple devices in connected stages. Furthermore, the output levels do not have adequate reproducibility for large scale integration. For these reasons, the '838 patent described a cell that used CMOS FETs to amplify the output.

Figure 3A:
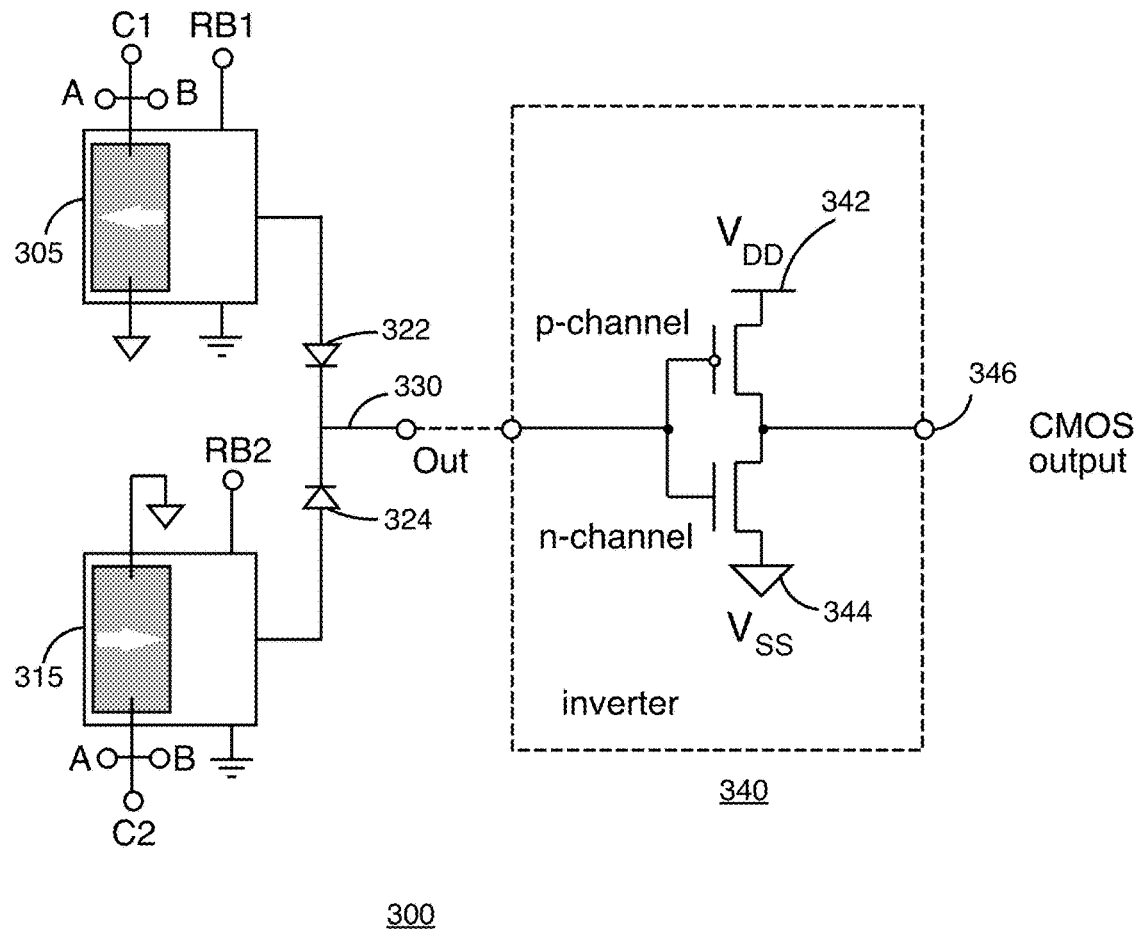
FIG. 3A is an embodiment of a reconfigurable composite logic cell composed of two improved HHE devices (FIG. 2D) and having a simple CMOS inverter.

A new reconfigurable Boolean function unit (BFU) 300, which includes the new HHE device (FIG. 2D) modified with a capability that inputs can use current pulses and STT, is described in FIG. 3A. This figure shows a cell with a parallel interconnected combination of a single HHE device 305 and a single inverted HHE device 315. Because of the relatively low impedance of ME devices 305, 315, diodes 322 and 324 are used at the output of each device, in a preferred embodiment, to prevent dissipation of output voltage through the contiguous device.

In one preferred embodiment, a buffered output 340 using a pair of FETs (an inverter) can easily provide sufficient drive to bring the output levels of the HHE BFU to CMOS levels. The implementation of this simple inverter is not crucial to the invention. Output levels can be set to CMOS levels by buffering the output in a number of well-known ways.

This configuration of two new HHE devices can be used to generate five unique (separate) Boolean functions if two separate operation/function control signals C1 and C2 are implemented, along with two readout bias signals RB1 and RB2. This BFU 300 can thus operate as a NAND, NOR, AND, OR and XOR gate, as described with the table in FIG. 3B (in a manner as similarly described in '838). The HIGH and LOW outputs at terminal 334 are $V_{DD}$ and $V_{SS}$, respectively.

Those skilled in the art will appreciate that it is also possible to obtain an XNOR function through minor modifications to device 300. In a preferred embodiment, an additional inverter 340' (not shown) would follow inverter 340 with a switch (not shown) between the two. An additional third control pulse RB3 is used as well. For the first five functions, RB3 sets the switch to be open and the output is read at 346. For XNOR, RB3 sets the switch to be closed and readout is at an output (not shown) of the second inverter. Other implementations will be apparent to those skilled in the art.

As was noted in '838 this type of device 300 can be implemented as a logical functional building block for higher level processing devices, such as microprocessors, digital signal processors, RISC processors, programmable logic, etc. The expression "logic" device, therefore, as used herein is intended in its broadest connotation and intended to include such logical operations, numeric operations, etc. For purposes of simplifying and understanding the more important aspects of the present invention, certain less essential features of the device (such as the grounds for the write wires and for the device itself, the layout of the write layer and read terminal, etc.) are omitted from further discussion herein. It will be understood also that specific implementations of the inventive devices will vary from application to application.

It can be seen that the reconfigurable logic cell in FIG. 3A can operate as the ALU in a nonvolatile logic circuit such as described in the aforementioned '656 patent embodiments. As noted above, FIG. 1 represents a generic description of a reconfigurable logic cell 100 used as an ALU. As further explained, this cell includes a separate nonvolatile memory element 122 that provides voltage readout as an alternative to current readout. The operation of the cell involves 4 steps. As presented in '656, the operational steps in the case of the MFCAD ALU are as follows:

1) Transmitting a functional control or configuration pulse to terminal C 102: this sets the magnetization of the "Control" F element and thereby controls the function of the device, for example to perform one of several possible Boolean operations. Examples are AND/OR; NAND/NOR etc. In this nomenclature, the abbreviation "A?B" represents a chosen operation.

2) Transmitting input operand or data pulses to input terminal A 104 and input terminal B 106: these pulses set magnetization states of two F elements that provide local fields to the MFCADs. The configuration of orientations determine the output of the gate.

3) Transmitting a current read pulse to bias terminal D 108: this applies a voltage pulse across the diode channel and results in a current that depends on the resistance of the channel so that it can be associated with two different distinguishable current conditions, where a first current is larger than a second current for example. This current in turn, depends on input fields that result from inputs A and B. This "readout" of the results can be done at any time after step (2) and provides a current output. This current also is sent as an input to a magnetic storage element 122, such as an MTJ or a separate magnetic field controlled avalanche diode (MFCAD), in the same cell. Again as alluded to previously, pulses to terminals C, A, B and D may share a common ground 216. The output current may be sensed by an ammeter between terminal 108 and ground 116. Alternatively, the output current may be made available at a separate terminal 112.

4) Transmitting a voltage read pulse to bias terminal E 110: this applies a voltage pulse to the nonvolatile magnetic storage element 122 and the output 112 indicates the stored value. Depending on the type of magnetoelectronic device used, the output could be a high or low voltage (using an MTJ) or a high or low current (using an MFCAD). A voltage readout may be convenient for transmission to an output port, or as a voltage bias to another device. Those skilled in the art will note that in the first 2 steps, the input pulse is configured as a current pulse but other circuit considerations may allow the pulse to be defined as a voltage pulse as well.

Figure 3C:
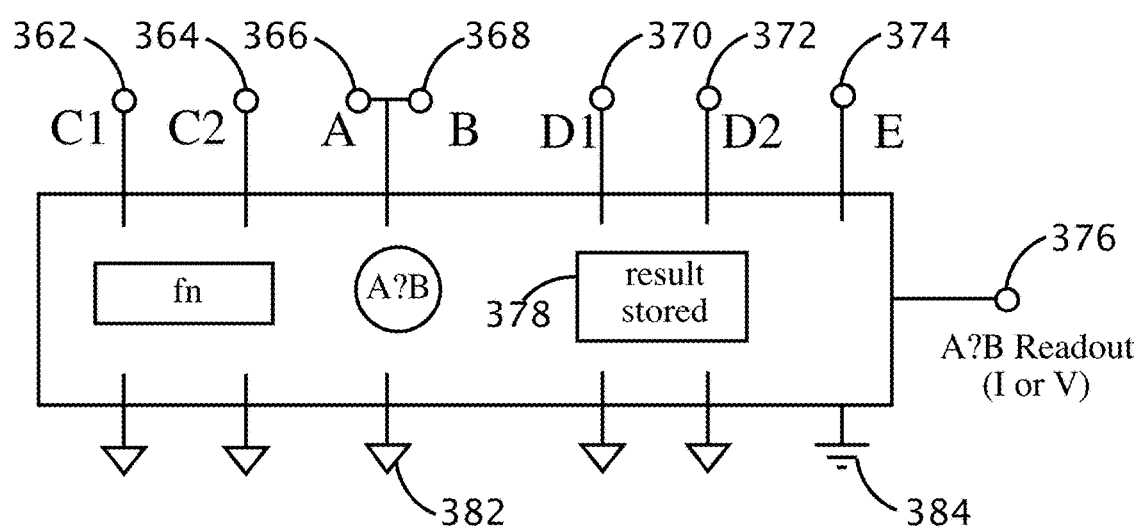
FIG. 3C is an embodiment of an ALU, using an improved HHE device cell such as shown in FIG. 2C, and which is suitable for use in the nonvolatile logic architecture of '656.

FIG. 3C represents an ALU 350, suitable for the architecture of '656, in which the reconfigurable logic cell is the buffered HHE cell 300 shown in FIG. 3A. This cell operates with the same basic read/write operational steps used above to describe the operation of cell 100 in FIG. 1. In one embodiment, this cell also is includes a separate nonvolatile memory element 378.

Following the description of FIG. 3A, the output levels are preferably CMOS HIGH and LOW levels, $V_{DD}$ and $V_{SS}$. These voltage levels can be converted to currents, if needed for input to a subsequent ME cell. Depending on particulars and requirements of the circuit, the current can be determined by a resistor in a wire that's part of a subsequent stage of the circuit. Alternatively, ALU 350 can have two output terminals separated by a switch (not shown). One output terminal delivers the output in the form of different voltage levels. The other terminal includes a resistor that determines and outputs one of a plurality of different appropriate current levels. In this embodiment, a pulse to terminal E 374 sets the switch to select one of the two output terminals to be output at terminal 376.

The operation of cell 350 now can be compared to the operation of cell 100 in FIG. 1:

1) A reset pulse to terminal C1 initializes the magnetization orientation of the free ferromagnetic film of device 305 (FIG. 3A) to point left. A reset pulse to terminal C2 initializes the magnetization orientation of the free ferromagnetic film of device 315 (FIG. 3A) to point right.

2) Control/configuration and input pulses are applied simultaneously. Separate control configuration pulses are sent to terminals C1 362 and C2 364 in accordance with a desired operation to be performed (FIG. 3B). Data input pulses are sent to terminal A 366 and B 368 for the operands. The A and B input pulses are applied to both devices 305 and 315. The abbreviation "A?B" represents the chosen operation. Again, referring to FIG. 3B, the operation can be configured to be AND, OR, NAND, NOR or XOR. Application of these pulses sets the magnetization states of the two respective F films in devices 305 and 315, according to the chosen Boolean process. The output of gate 350 is now determined based on the combination of configuration and data input signals.

3) Transmit a pulse to bias terminal E 374 to set the output 376 to be a current.

4) Transmit four simultaneous pulses: RB1 to terminal D1 370, RB2 to D2 372, a pulse $V_{DD}$ applied to 342 (FIG. 3A), and a pulse $V_{SS}$ applied to 344 (FIG. 3A). The output of the chosen operation will be a current pulse at terminal 376, with LOW amplitude $I_{OUT}=V_{SS}/R_W\sim0$ (binary 0) or HIGH amplitude $I_{OUT}=V_{DD}/R_W$ (binary 1). This Readout process can occur at any time after step (2).

5) Transmit a pulse to bias terminal E 374 to set output 376 to be a voltage.

6). Repeat Step (4). The output of the chosen operation will be a voltage pulse at terminal 376, with LOW amplitude $V_{OUT}=V_{SS}\sim0$ (binary 0) or HIGH amplitude $V_{OUT}=V_{DD}$ (binary 1).

Using these steps, the nonvolatile logic architecture of '656 can be implemented using the new reconfigurable HHE device cell 350 (FIG. 3A). This first embodiment has significant advantages as explained below.

First, the output levels are highly reproducible and have larger magnitude than MCFCADs and similar devices. Furthermore, the device can be reconfigured among five functional choices rather than two. As noted above, this could be expanded by including additional circuitry.

Figure 4A:
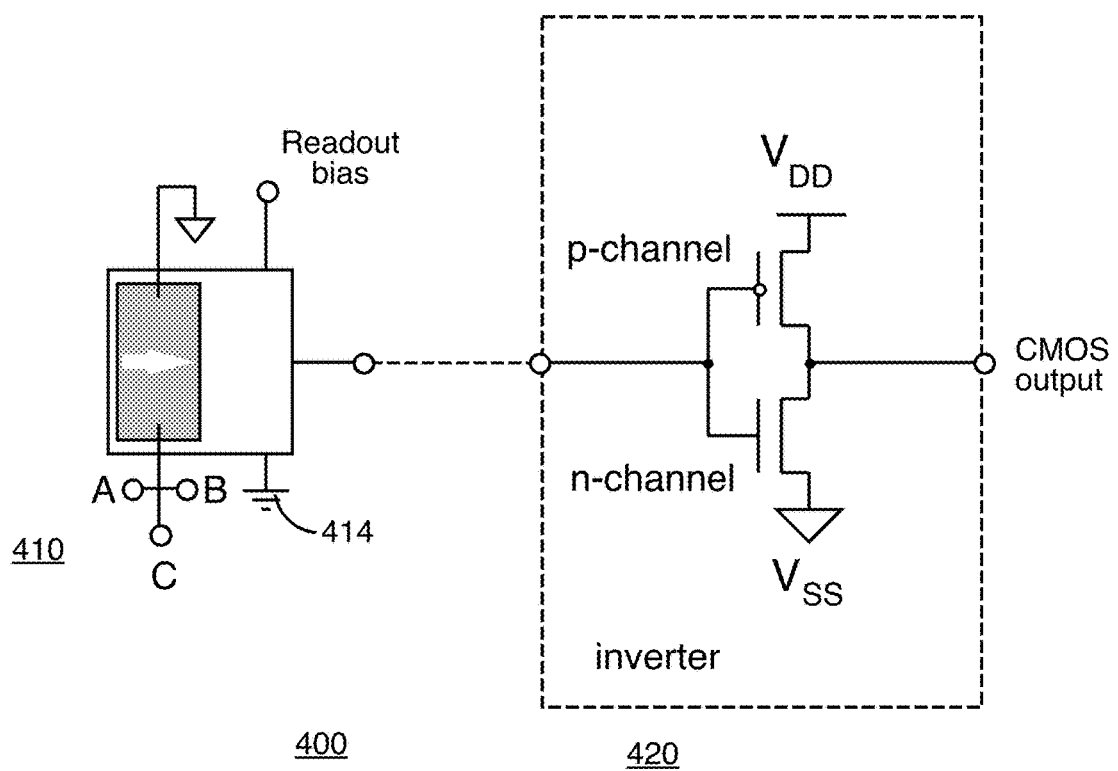
FIG. 4A is an embodiment of a reconfigurable composite logic cell composed of a single improved HHE device, with inverted inputs (FIG. 2B), and a CMOS inverter which performs the functions AND/OR; a noninverting CMOS buffer would perform the functions NAND/NOR.

In addition, there may be applications that demand CMOS output levels, but only require a logic gate that can reconfigure between two choices (AND/OR; NAND/NOR). The simpler structure depicted in FIG. 4A represents a subtype of an ME circuit embodiment that can satisfy these requirements while using fewer devices than are used in the embodiment of FIG. 3A. In FIG. 4A, an ME circuit embodiment shows an output of inverted HHE device 410 that is amplified by an inverter 420. In another subtype of ME circuit embodiment shown in FIG. 4B, the output of HHE device 460 is amplified by buffer amplifier 470.

Figure 4B:
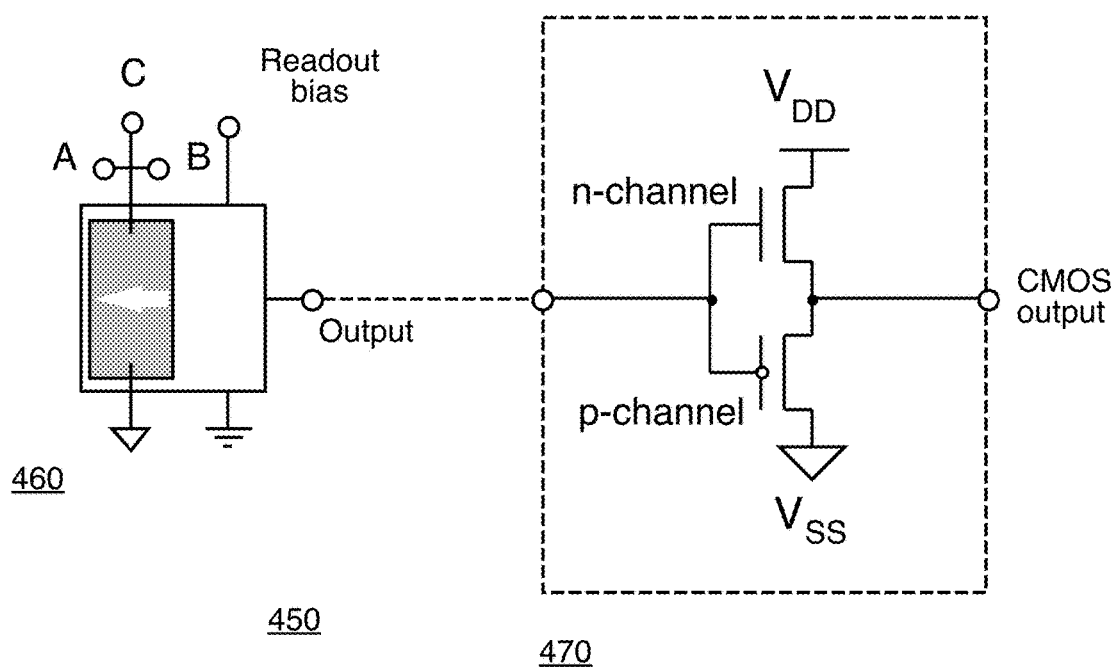
FIG. 4B is an embodiment of a reconfigurable composite logic cell composed of a single improved HHE device (FIG. 2D) and a CMOS buffer amplifier which performs the functions AND/OR; a cell with inverting CMOS amplifier would perform the functions NAND/NOR.

Those skilled in the art will recognize that each ME cell circuit may have advantages in different circuits and applications. As discussed above, the ground to a Readout bias pulse acts as a reference to an HHE output voltage. In the amplifier cells 420 and 470, the voltage applied to the gate uses reference 414 as ground. As discussed above, the choice of gate voltage ground, for example source, drain or body for semiconductor FETs, will vary according to the specific application. The idea of a composite HHE device cell, as seen in FIGS. 4A and 4B, has been discussed in my prior patent '838 and in other scientific literature. The present invention uses the improved HHE device (with STT input) and furthermore shows that these new cells are also appropriate reconfigurable logic units for the ALU shown in FIG. 1. Therefore, the nonvolatile logic architecture described in '656 can be implemented using these cells.

The present disclosure enables reconfigurable Boolean logic cells that are based on the improved HHE device. This device (FIG. 2D) has input current pulses of relatively small magnitude (much smaller than the magnitude required of prior art HHE inputs). The LOW output level is approximately 0V. Relatively large output levels have been achieved with compound III-V semiconductor heterostructures, such that a HIGH output level of order 100 mV can be achieved. The composite HHE cells shown in FIGS. 3A, 4A, 4B benefit from a simple structure and CMOS output levels.

As another aspect of the present invention, the nonvolatile logic architecture presented in '656 further uses numerous nonvolatile switches in the sub-circuits and circuits. A nonvolatile switch can be made using the improved HHE cells described herein along with a single semiconductor FET.

Figure 5:
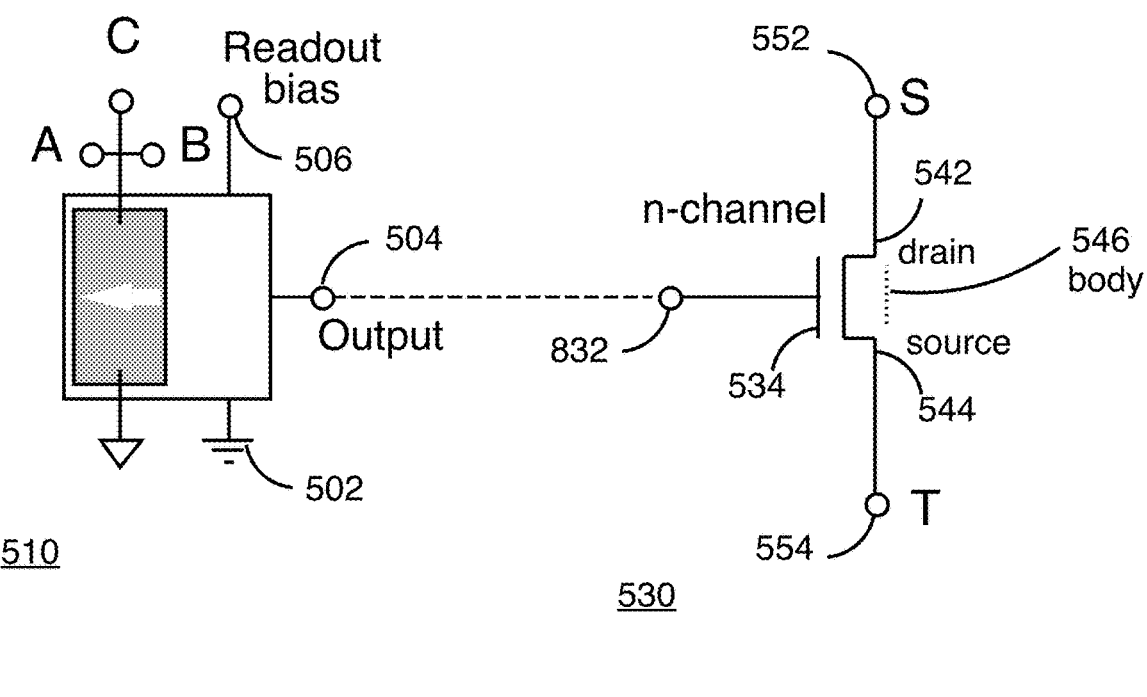
FIG. 5 is an embodiment of a nonvolatile switch composed of a single improved HHE device (FIG. 2D) and a single field effect transistor (FET).

One embodiment, shown in FIG. 5, is comprised of an HHE device 510 and an enhancement mode FET 530. The HHE Output 504 is preferably provided to terminal 532 and therefore to a gate 534 of an n-channel enhancement mode FET 530. The Output voltage, with HIGH value typically of $2DV_H$, is defined relative to a read bias ground 802. This same ground can be attached to the source 544, drain 542 or body 546 of the FET 530. It will be apparent to those skilled in the art that a variety of choices for grounding the gate voltage can be used. Alternatively, the output 504 can be treated as a floating voltage and a pull-up or pull-down resistor can be added at terminal 532. When HHE 510 is in a logical low state (binary 0), Output=0 V, the n-channel FET is not conducting, and there is open circuit between terminals S 552 and T 554. When HHE 510 is in a logical high state (binary 1), the voltage at 504 is Output=+$2DV_H$. The magnitude of $2DV_H$ can be the order of 100 mV (or some other figure suitable for the particular implementation), sufficient to exceed the threshold voltage of an appropriately chosen FET. The n-channel FET 530 then becomes conductive, resulting in a low resistance connection between terminals S 552 and T 554. Following this description, the circuit of FIG. 5 operates as a nonvolatile switch. The state of the switch (open or closed) therefore is determined by the nonvolatile state of HHE device 510. The switch becomes actively open (high impedance) or closed (low impedance) in response to and whenever bias is applied to readout terminal 506 of HHE device 510.

Figure 6A:
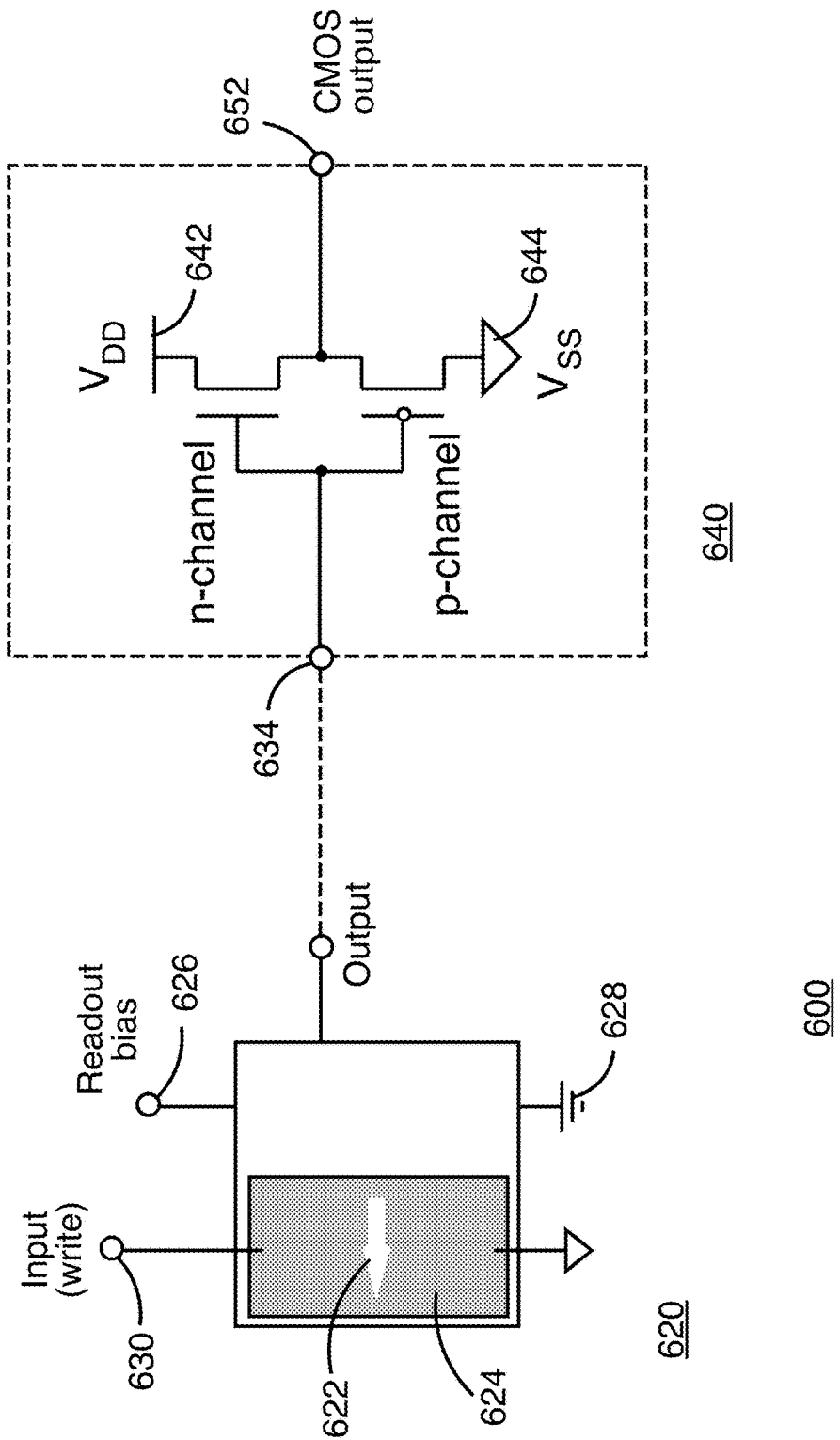
FIG. 6A is an embodiment of a composite nonvolatile memory cell composed of a single improved HHE device (FIG. 2D) and a CMOS buffer amplifier.

FIG. 6A shows yet another embodiment of the invention, in which a composite cell 600 is composed of an HHE device and two FETs in a buffer amplifier 640. In this configuration, cell 600 operates as a nonvolatile memory cell.

The process of storing data (in this case a single bit) takes two steps. In the first step, a Reset current pulse is applied to Input 630. As discussed in prior section in this specification, the Reset may be a voltage pulse, in which case a resistor is chosen to have a value $R_W$. The sum $R_{tot}$ of $R_W$ plus the resistance of the source film is such that the reset voltage applied across $R_{tot}$ results in a current amplitude 6 that is sufficient to set the magnetization orientation of the free film 624. If the input is a current pulse, no series resistor is needed.

In the second step, an input write pulse is applied to Input terminal 630. For logical/binary 0, the amplitude of the input pulse is preferably selected to be zero, for either voltage or current inputs. For logical/binary 1, an input current pulse preferably is chosen to have amplitude 6, sufficient to switch a magnetization orientation of free film 624. An input datum voltage pulse is set to have the same amplitude as a Reset voltage pulse but opposite polarity. The binary value is stored in a nonvolatile way in the form of the final resulting orientation of free film 624.

Readout of the stored value is performed at any desired later time. A Readout bias pulse (typically from a voltage source such as $V_{DD}$) is applied from Readout bias terminal 626 to ground 628. Synchronous pulses of supply voltage $V_{DD}$ 642 and $V_{SS}$ 644 are applied to the n-channel and p-channel FETs, and CMOS level voltage pulses $V_{SS}$ (LOW, binary 0) or $V_{DD}$ (HIGH, binary 1) are produced at the output 652. Pulse duration is not critical, although the external circuit may impose other conditions.

It will be clear to those skilled in the art that other variations of cells 620 and 640 may be used to advantage, according to specific demands of a circuit. Examples include using an inverted HHE cell. Another example is the use of an inverting buffer amplifier for 640. It is also clear that a separate Reset input terminal may show advantage in some circuits. The requirements of an application may result in one embodiment being preferred over another.

Figure 6B:
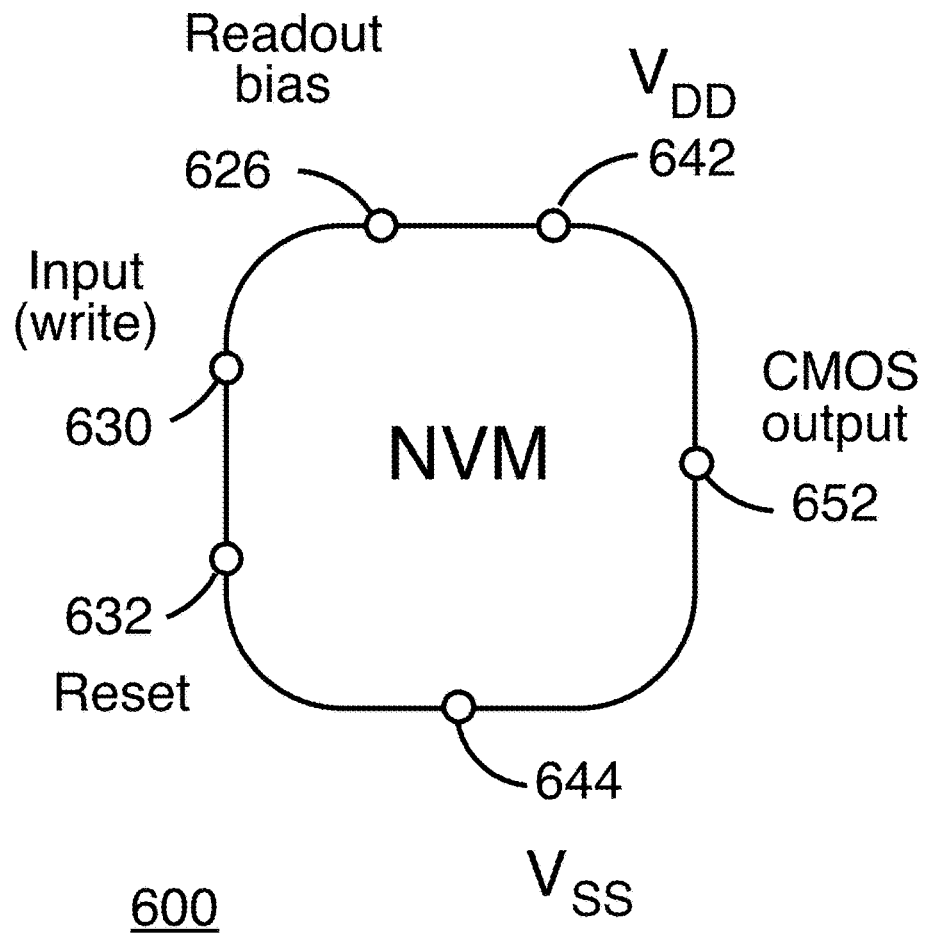
FIG. 6B shows a circuit symbol representing a nonvolatile memory cell.

A circuit symbol for a novolatile memory (NVM) cell 600 is shown in FIG. 6B. There may conditions for which a preferred embodiment includes a separate input terminal 632 for the reset pulse. More generally, the reset pulse may be applied at an input terminal 630.

Figure 7:
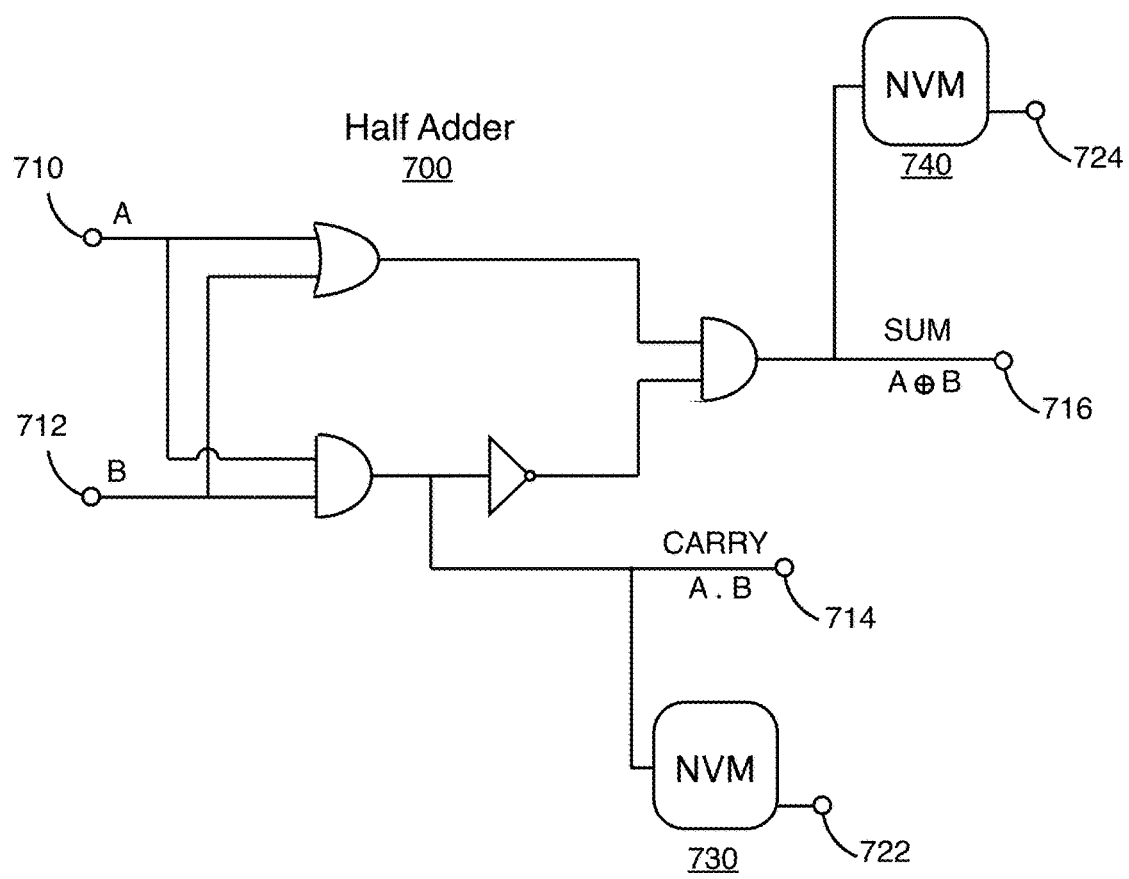
FIG. 7 is an embodiment of an improved semiconductor logic circuit, a half adder, which includes 2 nonvolatile memory cells of the type shown in FIG. 6A.

As noted earlier, the nonvolatile logic architecture presented in '656 also employs several nonvolatile memory cells (NV memory). For example, such a cell is used as a test register at the output stage of the ALU, and such cells are used as data registers at the data input/output ports. The nonvolatile memory cell (NVM) described with FIGS. 6A and 6B is an appropriate memory cell for use in the '656 architecture where it can be integrated with other ME devices of like materials, functionality and peripheral (I/O signal generation) requirements. As another aspect of the present invention, nonvolatile memory cell 600 can be used with advantage in simple traditional semiconductor technology (such as CMOS) sub-circuits and circuits. A simple embodiment of a magnetoelectronic/semiconductor adder circuit is shown in FIG. 7. This figure schematically shows a Half Adder sub-circuit 1000 using a combination of CMOS AND, OR and NOT gates. The Half Adder 700 is driven by a conventional clock circuit (not shown). Synchronized input pulses are applied at terminals A 710 and B 712. The output is a SUM bit (0 or 1) and a CARRY bit (0 or 1) that appear synchronously at terminals 716 and 714, respectively.

In normal operation, the output values are passed to inputs of other logic sub-circuits. Alternatively, the values may be sent to a temporary memory register that stores the values until they are needed, typically a few clock cycles later.

There may be occasions when the SUM and CARRY bits are not needed until a later time, that is, for thousands or millions of clock cycles. There may be other occasions when the output bits are needed at a much later time (seconds, hours or even longer). Nonvolatile memory cells 730 and 740 can be added to the Half Adder circuit, as shown in FIG. 10, to provide nonvolatile storage of the SUM and CARRY bit values. The Half Adder 1000 can be powered down until it is needed again. The values of the SUM and CARRY bits can be provided to another sector of the circuit, in the form of CMOS pulses, by applying voltage pulses to cells 730 and 740 in the manner described above.

During operation of the Half Adder cell 1000, reset pulses are sent to the two cells 730 and 740 during a first clock pulse. The next clock pulse applies simultaneous input pulses to A 710 and B 712. When output CARRY pulse reaches 714, that pulse is also applied as input to NVM 730 and simultaneous supply pulses are applied to NVM 730. When the output SUM pulse reaches 716, that pulse is also applied as input to NVM 1040 and simultaneous supply pulses are applied to NVM 1040. At any later time, the stored SUM and CARRY values are available at 716 and 722, respectively, and are supplied to subsequent circuits by applying Readout bias and supply ($V_{DD}$ and $V_{SS}$) pulses to these two NVM cells.

While this is a relatively simple example using a low level sub-circuit, NVM cells can be added to other types of CMOS sub-circuits and circuits of greater complexity for similar purposes. At a higher level, NVM cells can be added to a sector of circuits in a processing chip, to store any desired number of data values that result from ongoing computations. This can be valuable if other portions of the chip are not ready to receive these values. The computing sector that generated the data can be powered down until it is needed again. The values that resulted from the computation of that sector are available to other portions of the chip at any time.

The examples above are merely illustrative of the general principles to inherent in the teaching of the present invention. Other variations will be apparent to skilled artisans, and the present invention is by no means restricted to such embodiments and examples.

What is claimed is:

1. A logic circuit implemented with magnetoelectronic devices and situated on a single semiconductor chip, comprising:
    a processing circuit that includes at least one first Hall Effect device adapted to perform a first set of operations on data inputs during an operational mode;
    wherein said first Hall Effect device comprises a first magnetoelectronic structure including:
    i) a first ferromagnetic film having a configurable magnetization orientation;
    ii) a second ferromagnetic film having a fixed magnetization orientation;
    iii) a barrier film situated between said first ferromagnetic film and second ferromagnetic film and configured to conduct and impart a spin-torque transfer current to set a state for said configurable magnetization orientation in said first ferromagnetic film;
    further wherein said first Hall Effect device is a passive device that consumes substantially zero quiescent power in a non-operational mode;
    said processing circuit being adapted such it can be reconfigured dynamically during said operational mode to perform a second set of operations on data inputs.

2. The device of claim 1 further including a first data input, a second data input, and a configuration input coupled to a summing node and said second ferromagnetic film.

3. The device of claim 1 wherein the device state can be read by detecting an electrical signal that is related to a fringe field imparted by said first ferromagnetic film acting on an electrical current flowing in said Hall Effect device.

4. The circuit of claim 1 wherein said operational mode can be activated in response to a set of operational pulses received from an external pulse circuit and/or onboard pulses from one or more of magnetoelectronic devices.

5. The circuit of claim 1 wherein said operational mode includes either a memory storage operation or a boolean logic operation.

6. The circuit of claim 5 further including at least one third Hall Effect device configured to function as a switch.

7. The circuit of claim 1 further including at least one second Hall Effect device integrated with and configured to store a result of an operation performed by said first Hall Effect device.

8. The circuit of claim 1 wherein the processing circuit performs both AND/OR functions when said first ferromagnetic film has a first initial state, and the device performs both NAND/NOR function when said first ferromagnetic film has a second initial state.

9. The circuit of claim 8 wherein said semiconductor circuit includes one of a CMOS inverter, a CMOS amplifier and a FET switch.

10. The circuit of claim 8 wherein said semiconductor circuit includes a half-adder circuit.

11. The circuit of claim 1 wherein the processing circuit is connected to and integrated with a semiconductor circuit in a common region of the single semiconductor chip.

12. The circuit of claim 1 wherein the first Hall Effect device has a logical low output value of approximately 0 volts.

13. A reconfigurable processing system implemented with magnetoelectronic devices and situated on a single semiconductor chip, comprising:
    a first memory circuit that includes a first plurality of Hall Effect devices of a first type adapted to store program data and operations data;
    wherein each of said first plurality of first type of Hall Effect devices comprises a first magnetoelectronic structure including:
    i) a first ferromagnetic film having a configurable magnetization orientation;
    ii) a second ferromagnetic film having a fixed magnetization orientation;
    iii) a barrier film situated between said first ferromagnetic film and second ferromagnetic film and configured to conduct and impart a spin-torque transfer current to set a state for said configurable magnetization orientation in said first ferromagnetic film;
    further wherein said first plurality of Hall Effect devices are passive devices that consume substantially zero quiescent power in a non-operational mode;
    a second processing circuit that includes a first and second Hall Effect device of a second type paired together and adapted to perform a first set of operations during an operational mode in accordance with a first program stored in said first memory circuit;
    wherein said first and second Hall Effect devices are paired together with respective first and second outputs coupled together, and are arranged to include at least one inverted write line structure to enable single polarity data inputs to such devices;
    further wherein each of said paired Hall Effect devices also comprises said magnetoelectronic structure and are passive devices that consume substantially zero quiescent power in a non-operational mode;
    said second processing circuit and said first memory circuit being adapted such that devices therein only consume power during said operational mode, which operational mode is activated in response to a set of operational pulses received from an external pulse circuit and/or onboard pulses from one or more of said first plurality of magnetic field controlled devices and/or one or more second magnetic field controlled devices;
    further wherein said second processing circuit can be reconfigured dynamically during said operational mode to perform a second set of operations on data for the reconfigurable processing system.

14. The reconfigurable processing system of claim 13 wherein the processing circuit performs AND, OR, NOR, NAND and XOR functions based on an initial state set for said first and second Hall Effect devices.

15. The reconfigurable processing system of claim 13 wherein said first and second Hall Effect devices are connected to and integrated with a CMOS circuit in a common region of the single semiconductor chip.

16. The reconfigurable processing system of claim 13 wherein an output of the system can be configured to be a current or a voltage.

17. A non-volatile switch implemented with a magnetoelectronic device comprising:
   a first non-volatile memory circuit that includes a first hybrid Hall Effect (HHE) device having a first input and a first output;
   a second semiconductor FET configured as a switch and having a gate signal provided by said first output from said first non-volatile memory circuit;
   wherein the HHE device further comprises:
   i) a first ferromagnetic film having a configurable magnetization orientation;
   ii) a second ferromagnetic film having a fixed magnetization orientation;
   iii) a barrier film situated between said first ferromagnetic film and second ferromagnetic film and configured to conduct and impart a spin-torque transfer current to set a state for said configurable magnetization orientation in said first ferromagnetic film;
   further wherein an input signal to said first input of said first HHE device determines a stored non-volatile state which is useable for controlling said switch.

18. The non-volatile switch of claim 17 wherein the HHE device and FET are integrated and interconnected within a common region of a integrated circuit.

19. A non-volatile memory cell implemented with a magnetoelectronic device comprising:
   a first hybrid Hall Effect (HHE) device having a first input and a first output;
   wherein the HHE device further comprises:
   i) a first ferromagnetic film having a configurable magnetization orientation;
   ii) a second ferromagnetic film having a fixed magnetization orientation;
   iii) a barrier film situated between said first ferromagnetic film and second ferromagnetic film and configured to conduct and impart a spin-torque transfer to current to set a state for said configurable magnetization orientation in said first ferromagnetic film;
   further wherein an input signal to said first input of said first HHE device determines a non-volatile data value stored in the memory cell.

20. The memory cell of claim 19 wherein the HHE device is configured and integrated with semiconductor components in a first region of an integrated circuit as part of a non-volatile memory cell.

21. The memory cell of claim 20 wherein the HHE device is self-contained and not part of a non-volatile memory cell array.

22. A method of operating a reconfigurable processing system situated on a single semiconductor chip, comprising:
   providing a magnetoelectronic processing circuit that includes one or more magnetolectronic device(s) adapted to perform a first set of instructions during an operational mode;
   wherein said one or more magnetolectronic device(s) include a first Hall Effect device comprising a first magnetoelectronic structure including:
   i) a first ferromagnetic film having a configurable magnetization orientation;
   ii) a second ferromagnetic film having a fixed magnetization orientation;
   iii) a barrier film situated between said first ferromagnetic film and second ferromagnetic film and configured to conduct and impart a spin-torque transfer current to set a state for said configurable magnetization orientation in said first ferromagnetic film;
   wherein each of said set of instructions carried out as an operation by the one or more magnetoelectronic device(s) requires a single pulse to be effectuated.

* * * * *